(12) United States Patent
Koetting et al.

(10) Patent No.: US 8,035,986 B2
(45) Date of Patent: Oct. 11, 2011

(54) BATTERY CELL INTERCONNECT AND VOLTAGE SENSING ASSEMBLY AND METHOD FOR COUPLING BATTERY CELL ASSEMBLIES THERETO

(75) Inventors: William Koetting, Davisburg, MI (US); Kwok Tom, Madison Heights, MI (US); David C. Robertson, Royal Oak, MI (US); Martin J. Klein, Grosse Pointe Park, MI (US)

(73) Assignee: LG Chem, Ltd. (KR)

( * ) Notice: Subject to any disclaimer, the term of this patent is extended or adjusted under 35 U.S.C. 154(b) by 635 days.

(21) Appl. No.: 12/164,681

(22) Filed: Jun. 30, 2008

(65) Prior Publication Data
US 2009/0323293 A1 Dec. 31, 2009

(51) Int. Cl.
*H05K 7/02* (2006.01)
*H05K 7/04* (2006.01)

(52) U.S. Cl. .................. 361/807; 361/759; 361/720

(58) Field of Classification Search .......... 361/600, 361/679.01, 752, 769, 760, 720, 748, 807, 361/810; 439/502, 504, 822, 816, 819
See application file for complete search history.

(56) References Cited

U.S. PATENT DOCUMENTS

| | | | |
|---|---|---|---|
| 4,951,385 A | 8/1990 | DeSanto | |
| 5,382,480 A | 1/1995 | Molyneux | |
| 5,639,571 A * | 6/1997 | Waters et al. | ............... 429/71 |
| 5,850,909 A | 12/1998 | Wagner | |
| 5,854,580 A | 12/1998 | Konda et al. | |
| 6,081,049 A | 6/2000 | Simmons | |
| 6,274,808 B1 * | 8/2001 | Cercioglu et al. | ............ 174/371 |
| 6,333,846 B1 | 12/2001 | Hashizawa et al. | |
| 6,399,238 B1 * | 6/2002 | Oweis et al. | ................. 429/99 |
| 6,459,558 B1 | 10/2002 | Hashizawa et al. | |
| 6,552,261 B2 * | 4/2003 | Shlahtichman et al. | ...... 174/384 |
| 7,077,704 B2 | 7/2006 | Ikeda et al. | |
| 7,091,878 B2 | 8/2006 | Holle et al. | |
| 7,270,576 B2 * | 9/2007 | Kim et al. | ................. 439/627 |
| 7,294,020 B2 | 11/2007 | Zhao et al. | |
| 7,362,232 B2 | 4/2008 | Holle et al. | |
| 7,545,135 B2 | 6/2009 | Holle et al. | |
| 7,563,137 B1 | 7/2009 | Koetting et al. | |
| 7,578,702 B1 | 8/2009 | Tom et al. | |

(Continued)

FOREIGN PATENT DOCUMENTS

EP 1089373 A1 4/2001

(Continued)

OTHER PUBLICATIONS

International Search Report for International application No. PCT/KR2009/003438 dated Jan. 22, 2010.
International Search Report for International application No. PCT/KR2009/003440 dated Jan. 22, 2010.
International Search Report for International application No. PCT/KR2010/002332 dated Oct. 29, 2010.

*Primary Examiner* — Hung S Bui
(74) *Attorney, Agent, or Firm* — Cantor Colburn LLP

(57) ABSTRACT

A battery cell interconnect and voltage sensing assembly and a method for coupling a battery cell assembly thereto are provided. The battery cell interconnect and voltage sensing assembly includes a circuit board, electrical interconnect members, and an electrical connector. The circuit board further has slots therethrough for receiving the electrical interconnect members thereon. Electrical terminals from battery cell assemblies are coupled to the electrical interconnect members. The circuit board also has electrical traces for routing voltages at the electrical interconnect members to the electrical connector for sensing voltages of the battery cell assemblies.

5 Claims, 5 Drawing Sheets

U.S. PATENT DOCUMENTS

| | | |
|---|---|---|
| 2003/0213121 A1 | 11/2003 | Rouillard et al. |
| 2005/0130033 A1 | 6/2005 | Iwamura et al. |
| 2006/0194101 A1 | 8/2006 | Ha et al. |
| 2006/0324558 | 10/2006 | Li |
| 2007/0238018 A1 | 10/2007 | Lee et al. |
| 2008/0124617 A1 | 5/2008 | Bjork |
| 2009/0033453 A1 | 2/2009 | Deno et al. |
| 2009/0325042 A1 | 12/2009 | Koetting et al. |
| 2010/0271168 A1 | 10/2010 | Niedzwiecki et al. |

FOREIGN PATENT DOCUMENTS

| | | |
|---|---|---|
| JP | 2007103238 A | 4/2007 |
| KR | 20080027504 A | 3/2008 |
| WO | WO00/30190 A1 | 5/2000 |

* cited by examiner

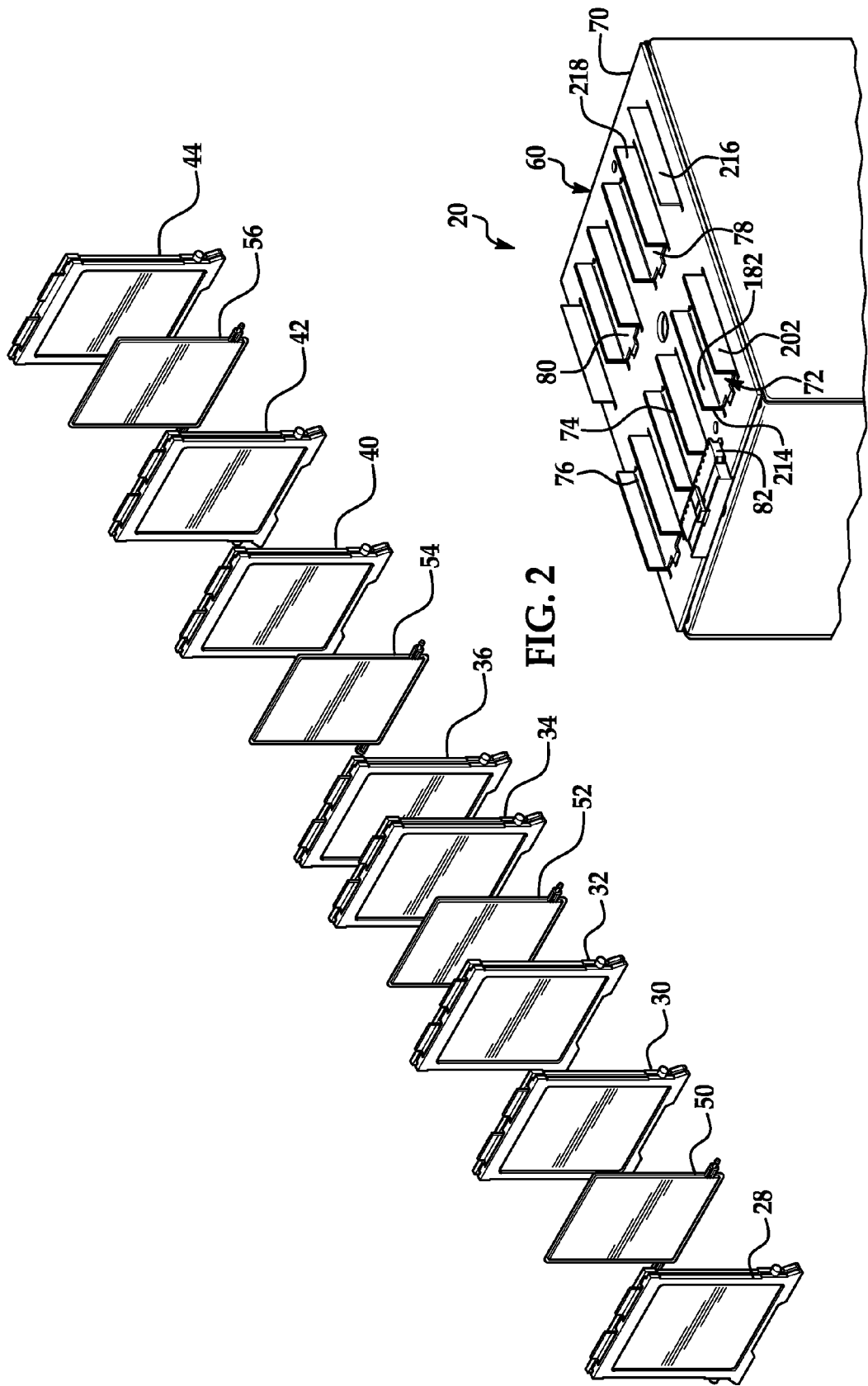

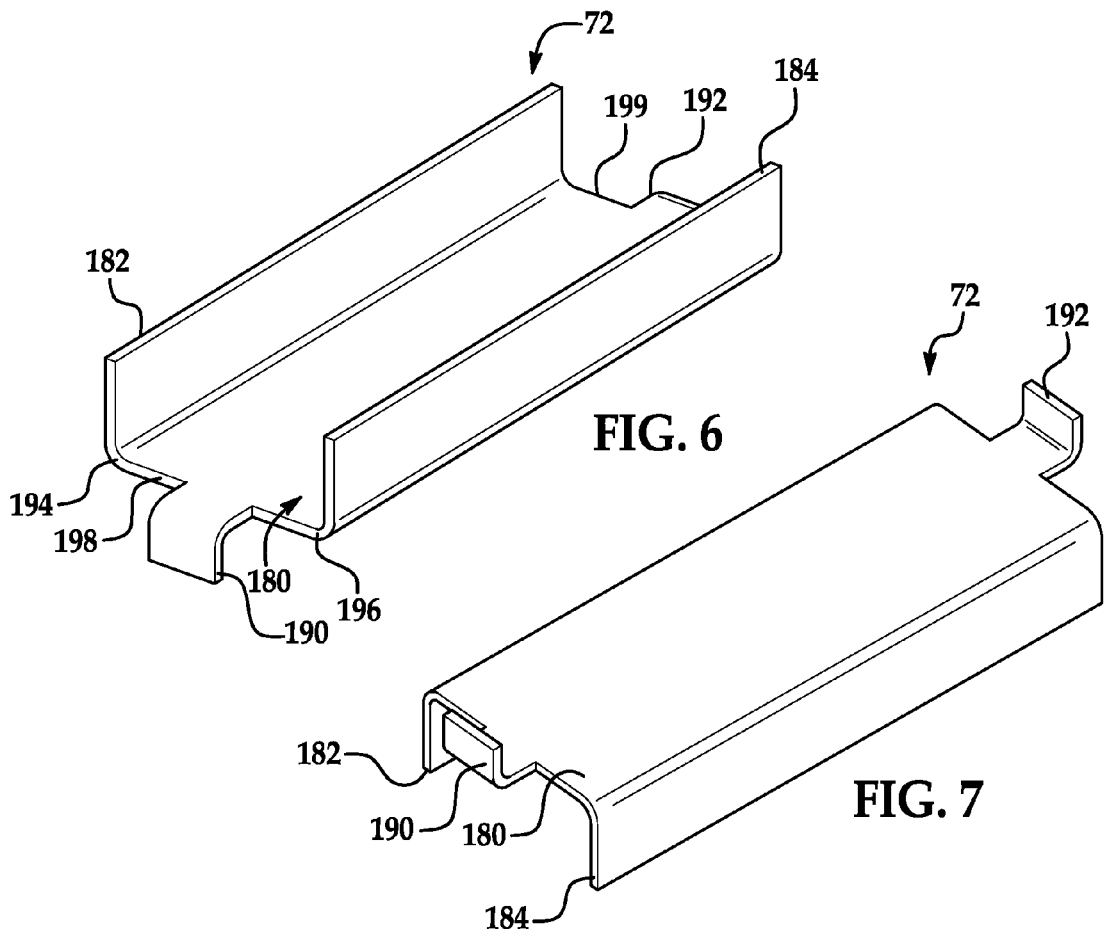
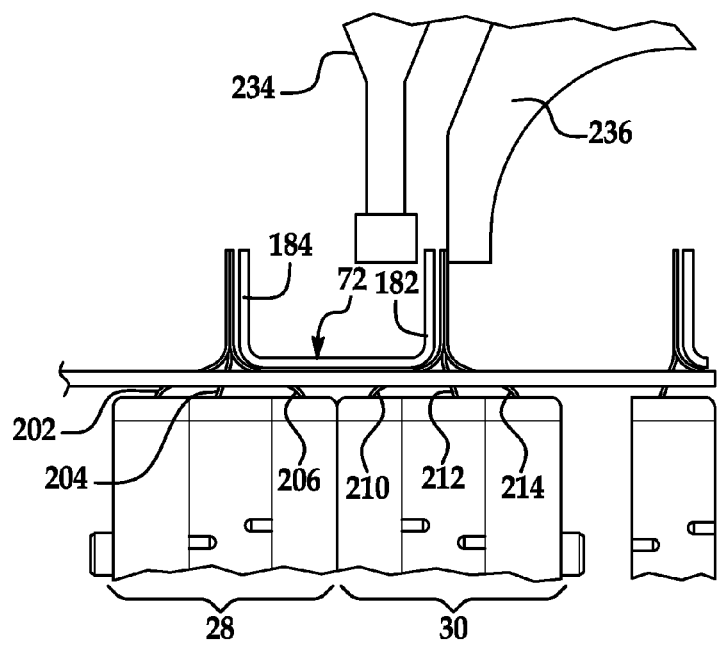

BATTERY CELL INTERCONNECT AND VOLTAGE SENSING ASSEMBLY AND METHOD FOR COUPLING BATTERY CELL ASSEMBLIES THERETO

TECHNICAL FIELD

This application relates generally to a battery cell interconnect and voltage sensing assembly and a method for coupling battery cell assemblies to the battery cell interconnect and voltage sensing assembly.

BACKGROUND OF THE INVENTION

Battery packs generally have a plurality of battery cells. During manufacture, electrodes on the battery cells can be bent toward each other and then mechanically fastened together utilizing a mechanical fastener. A problem associated with this methodology is that the electrodes are not mechanically supported which can cause the electrodes to bend and become degraded.

Accordingly, the inventors herein have recognized a need for a battery cell interconnect and voltage sensing assembly that minimizes and/or eliminates the above-mentioned deficiency.

SUMMARY OF THE INVENTION

A battery cell interconnect and voltage sensing assembly in accordance with an exemplary embodiment is provided. The battery cell interconnect and voltage sensing assembly includes a circuit board having a first side and a second side. The circuit board further has first and second slots and first and second apertures extending therethrough. The second side has first electrical trace disposed thereon. The battery cell interconnect and voltage sensing assembly further includes a first electrical interconnect member having a first rectangular plate, first and second side walls, and first and second tabs. The first rectangular plate is disposed on the first side of the circuit board. The first rectangular plate further has first, second, third, and fourth edges. The first and second side walls extend from the first and second edges, respectively, outwardly from the first rectangular plate in a first direction. The first and second tabs extend from the third and fourth edges, respectively, in a second direction and through the first and second apertures of the circuit board. The first tab is electrically coupled to the first electrical trace on the second side of the circuit board. The first side wall is configured to contact a first electrical terminal of a first battery cell assembly that extends through the first slot of the circuit board. The second side wall is configured to contact a second electrical terminal of a second battery cell assembly that extends through the second slot of the circuit board, such that the first electrical interconnect member electrically couples the first electrical terminal to the second electrical terminal. The battery cell interconnect and voltage sensing assembly further includes an electrical connector disposed on the first side of the circuit board and is electrically coupled to the first electrical trace. The first electrical trace extends from the electrical connector to the first tab for sensing a first voltage at the first tab.

A method for coupling battery cells to a battery cell interconnect and voltage sensing assembly in accordance with another exemplary embodiment is provided. The battery cell interconnect and voltage sensing assembly has a circuit board and an electrical interconnect member. The circuit board has a first side and a second side. The circuit board further has first and second slots and first and second apertures extending therethrough. The electrical interconnect member has a first rectangular plate, first and second side walls, and first and second tabs. The first rectangular plate is disposed on the first side of the circuit board. The first rectangular plate further has first, second, third, and fourth edges. The first and second side walls extend from the first and second edges outwardly from the first rectangular plate in a first direction. The first and second tabs extend from the third and fourth edges, respectively, in a second direction and through the first and second apertures of the circuit board. The method includes disposing a first electrical terminal of a first battery cell assembly through the first slot of the circuit board such that the first electrical terminal contacts the first side wall of the electrical interconnect member. The method further includes disposing a second electrical terminal of a second battery cell assembly through the second slot of the circuit board such that the second electrical terminal contacts the second side wall of the electrical interconnect member. The method further includes ultrasonically welding the first electrical terminal to the first side wall of the electrical interconnect member. The method further includes ultrasonically welding the second electrical terminal to the second side wall of the electrical interconnect member.

BRIEF DESCRIPTION OF THE DRAWINGS

FIG. 2 is a schematic of battery cell assemblies utilized in the battery module of FIG. 1;

FIG. 3 is a schematic of a battery cell interconnect and voltage sensing assembly utilized in the battery module of FIG. 1;

FIG. 6 is a schematic of an electrical interconnect member utilized in the battery cell interconnect and voltage sensing assembly of FIG. 3;

FIG. 7 is another schematic of the electrical interconnect member of FIG. 6;

FIG. 8 is a schematic of two battery cell assemblies of FIG. 2 electrically coupled to an electrical interconnect member of FIG. 6;

DETAILED DESCRIPTION OF AN EXEMPLARY EMBODIMENT

Figure 1:
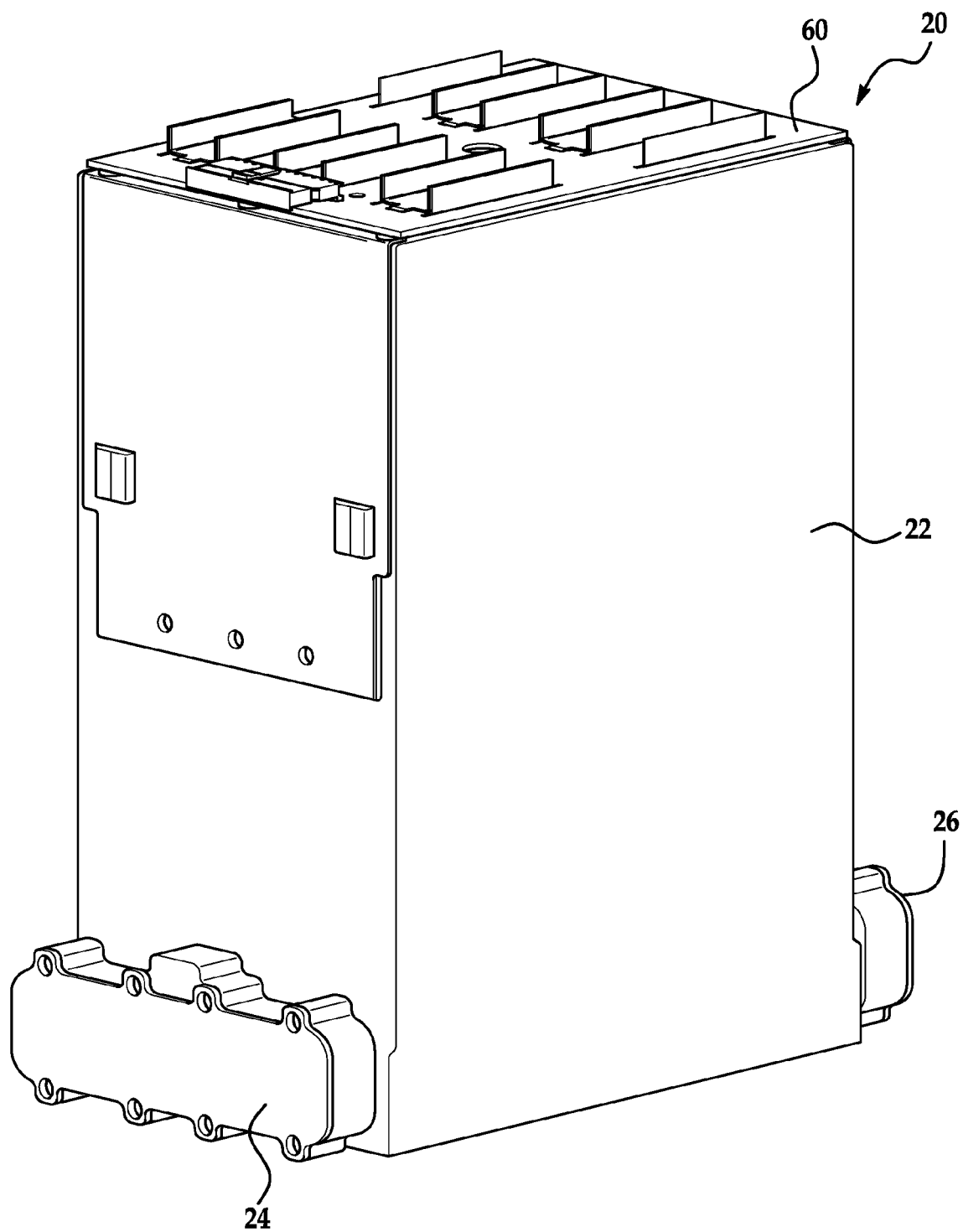
FIG. 1 is a schematic of a battery module in accordance with an exemplary embodiment.

Referring to FIGS. 1 and 2, a battery module 20 for providing electrical power is illustrated. The battery module 20 includes an outer housing 22, cooling manifolds 24, 26, battery cell assemblies 28, 30, 32, 34, 36, 40, 42, 44, heat exchangers 50, 52, 54, 56, and a battery cell interconnect and voltage sensing assembly 60. An advantage of the battery cell interconnect and voltage sensing assembly 60 is that the assembly 60 has both (i) electrical interconnect members that support battery cell assembly electrical terminals and route electrical current from the battery cell assembly electrical terminals and (ii) electrical traces electrically coupled to the electrical interconnect members which allow voltages on the electrical interconnect members to be sensed. A battery cell assembly is defined as a housing having at least one battery cell therein.

The outer housing 22 encloses the battery cell assemblies 28, 30, 32, 34, 36, 40, 42 and 44 and the heat exchangers 50, 52, 54 and 56 therein. The battery cell assemblies 28, 30, 32, 34, 36, 40, 42 and 44 each have a plurality of battery cells therein producing an output voltage and current. Referring to FIGS. 2 and 8, for example, the battery cell assembly 28 has three battery cells therein having positive electrical terminals 202, 204 and 206 (the negative electrical terminals of battery cell assembly 28 are not shown in FIG. 8). Further, the battery cell assembly 30 has three battery cells therein having negative electrical terminals 210, 212 and 214 (the positive electrical terminals of battery cell assembly 30 are not shown in FIG. 8).

Referring to FIGS. 1 and 2, the cooling manifold 24 is configured to route a fluid from a fluid reservoir to the heat exchangers 50, 52, 54 and 56 and other heat exchangers (not shown) in the battery cell assemblies 28, 30, 32, 34, 36, 40, 42 and 44 for cooling the battery cell assemblies 28, 30, 32, 34, 36, 40, 42 and 44. The cooling manifold 26 is configured to receive the heated fluid from the heat exchangers 50, 52, 54 and 56 and other heat exchangers in the battery cell assemblies 28, 30, 32, 34, 36, 40, 42 and 44 and to route the fluid to the fluid reservoir.

Figure 4:
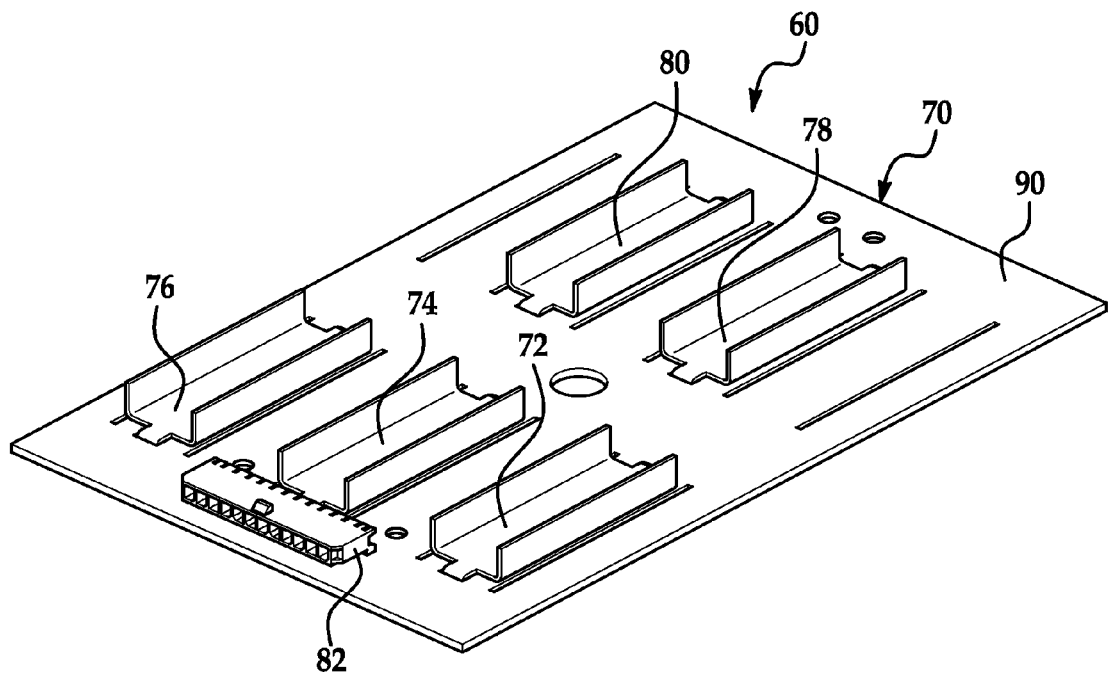
FIG. 4 is a schematic of a top side of the battery cell interconnect and voltage sensing assembly of FIG. 3.
Figure 5:
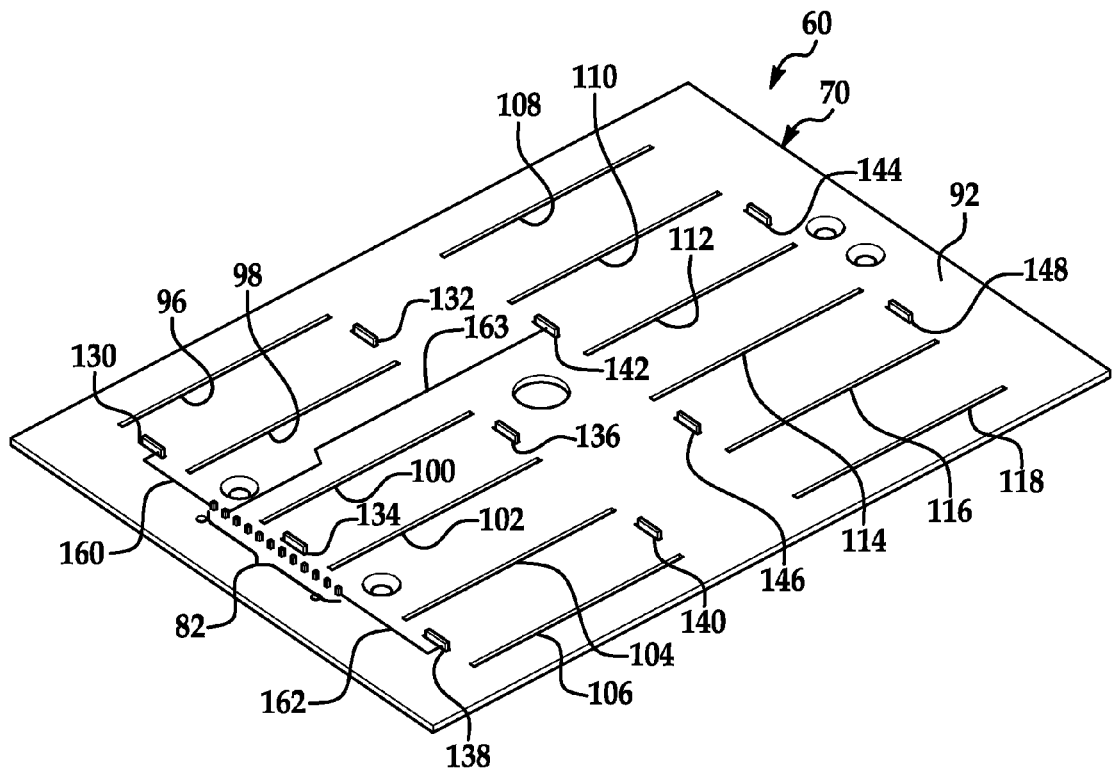
FIG. 5 is a schematic of a bottom side of the battery cell interconnect and voltage sensing assembly of FIG. 4.
Figure 9:
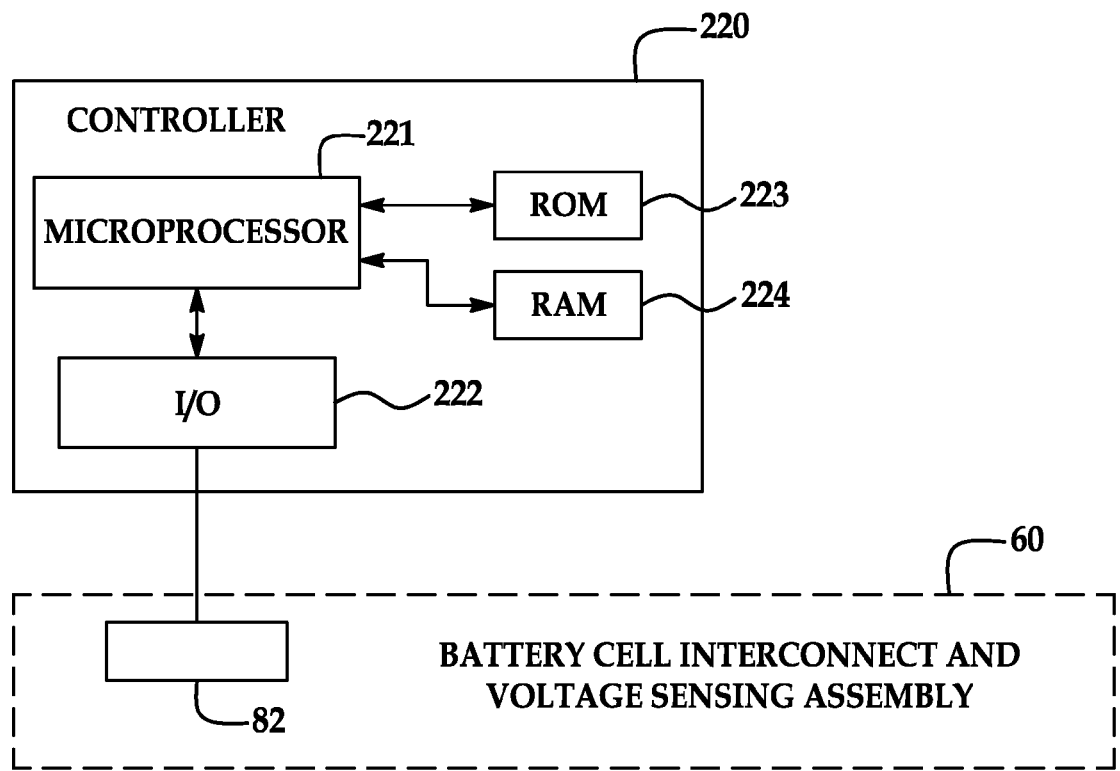
FIG. 9 is a schematic of a system for determining voltage values utilizing the battery cell interconnect and voltage sensing assembly of FIG. 3.

Referring to FIGS. 3, 4 and 5, the battery cell interconnect and voltage sensing assembly 60 includes a circuit board 70, electrical interconnect members 72, 74, 76, 78, 80 and an electrical connector 82. The assembly 60 is provided to electrically couple battery cell assemblies and to provide circuit traces and an electrical connector for sensing voltages of battery cell assemblies.

The circuit board 70 includes a side 90 and the opposite side 92. The circuit board 70 further includes slots 96, 98, 100, 102, 104, 106, 108, 110, 112, 114, 116 and 118 extending therethrough. The slots 96, 98, 100, 102, 104, 106, 108, 110, 112, 114, 116 and 118 are configured to receive side walls from electrical interconnect members therethrough for positioning the electrical interconnect members on the circuit board 70. The circuit board 70 further includes apertures 130, 132, 134, 136, 138, 140, 142, 144, 146 and 148 extending therethrough. The apertures 130, 132, 134, 136, 138, 140, 142, 144, 146 and 148 are configured to receive tabs of the electrical interconnect members therethrough. The circuit board 70 further includes electrical traces extending from each tab of an electrical interconnect member that extends through the circuit board 70—to a corresponding pin of the electrical connector 82. For example, an electrical trace 162 extends from a tab of the electrical interconnect member 76 to a corresponding pin of the electrical connector 82 for determining a voltage at the electrical interconnect member 76. Further, an electrical trace 160 extends from the electrical interconnect member 72 to a corresponding pin of the electrical connector 82 for determining a voltage at the electrical interconnect member 72. Further, an electrical trace 163 extends from the electrical interconnect member 78 to a corresponding pin of the electrical connector 82 for determining a voltage at the electrical interconnect member 78. The circuit board 70 also has additional electrical traces (not shown), such that there is an electrical trace for one tab on each electrical interconnect member, that extends from the tab to a corresponding pin on the electrical connector 82.

Referring to FIGS. 4, 5, 6 and 7, the electrical interconnect members 72, 74, 76, 78 and 80 are configured to be coupled to the circuit board 70. In exemplary embodiments, the electrical interconnect members 72, 74, 76, 78 and 80 are constructed from copper or a nickel-plated copper. However, in alternative embodiments, other electrically conducting materials can be utilized to construct the electrical interconnect members 72, 74, 76, 78 and 80. Each of the electrical interconnect members 72, 74, 76, 78 and 80 are further configured to be coupled to between electrical terminals from a first battery cell assembly and another battery cell assembly for routing electrical current from the first battery cell assembly to the another battery cell assembly.

The electrical interconnect member 72 includes a rectangular plate 180, side walls 182, 184, and tabs 190, 192. A bottom surface of the rectangular plate 180 is disposed on the side 90 of the circuit board 70. The rectangular plate 180 includes edges 194, 196 disposed substantially parallel to one another and edges 198, 199 disposed substantially parallel from one another. The side walls 182, 184 extend from the edges 194, 196, respectively, outwardly from the rectangular plate 180 in a first direction. The tabs 190, 192 extend from the edges 198, 199, respectively, in a second direction opposite to the first direction. The structure of the electrical interconnect members 74, 76, 78 and 80 are identical to the structure of the electrical interconnect member 72.

When the electrical interconnect member 72 is disposed on the side 90 of the circuit board 70, the tabs 190, 192 extend through the apertures 96, 98 respectively in the circuit board 70. Further, the side walls 182, 184 extend upwardly away from the side 90 of the circuit board 70. Referring to FIG. 8, in one exemplary embodiment, the side wall 182 of the electrical interconnect member 72 is coupled to the electrical terminals 210, 212, 214 from the battery cell assembly 30 by ultrasonically welding the side wall 182 to the electrical terminals 210, 212 and 214. Further, the side wall 184 of the electrical interconnect member 72 is coupled to the electrical terminals 202, 204 and 206 by ultrasonically welding the side wall 184 to the electrical terminals 202, 204 and 206.

Referring to FIGS. 4 and 5, when the electrical interconnect member 74 is disposed on the side 90 of the circuit board 70, the tabs of member 74 extend through the apertures 100, 102 respectively in the circuit board 70. Further, the side walls of the member 74 extend upwardly away from the side 90 of the circuit board 70. Still further, the side walls of the member 74 are coupled to electrical terminals from a pair of battery cell assemblies.

When the electrical interconnect member 76 is disposed on the side 90 of the circuit board 70, the tabs of member 76 extend through the apertures 104, 106 respectively in the circuit board 70. Further, the side walls of the member 76 extend upwardly away from the side 90 of the circuit board 70. Still further, the side walls of the member 76 are coupled to electrical terminals from a pair of battery cell assemblies.

When the electrical interconnect member 78 is disposed on the side 90 of the circuit board 70, the tabs of member 78 extend through the apertures 110, 112 respectively in the circuit board 70. Further, the side walls of the member 78 extend upwardly away from the side 90 of the circuit board 70. Still further, the side walls of the member 78 are coupled to electrical terminals from a pair of battery cell assemblies.

When the electrical interconnect member 80 is disposed on the side 90 of the circuit board 70, the tabs of member 80 extend through the apertures 114, 116 respectively in the circuit board 70. Further, the side walls of the member 80 extend upwardly away from the side 90 of the circuit board 70. Still further, the side walls of the member 80 are coupled to electrical terminals from a pair of battery cell assemblies.

Referring to FIGS. 4, 5, 6 and 9, the electrical connector 82 is disposed on the side 90 of the circuit board 70. The electrical connector 82 is provided to route low voltage signals from the electrical interconnect members 72, 74, 76, 78 and 82 to a battery controller 220. The electrical connector 82 has pins extending through the circuit board 70 which are electrically coupled to the electrical interconnect members 72, 74, 76, 78, 80 via electrical traces on the side 92 of the circuit board 90.

The battery controller 220 is provided to determine the voltages associated with each of the electrical interconnect members which are indicative of the voltages being output by battery cell assemblies coupled to the electrical interconnect members. The controller 220 includes a microprocessor 221, an input/output (I/O) interface 222, a read-only memory 223, and a random access memory 224. The I/O interface 222, the read-only memory 223, and the random access memory 224 operably communicate with the microprocessor 221. The I/O interface 222 is electrically coupled to the electrical connector 82 of the battery cell interconnect and voltage sensing assembly 60. The microprocessor 221 executes instructions for sampling voltages received from the electrical interconnect members 72, 74 76, 78, 80 via the electrical connector 82. The microprocessor 221 further determines voltage values associated with the electrical interconnect members 72, 74, 76, 78 and 80 based on the received voltages from the electrical interconnect members 72, 74, 76, 78 and 80, respectively. The microprocessor 221 further stores the voltage values in the random access memory 224 or in a non-volatile memory.

Referring to FIG. 3, for purposes of understanding, a brief explanation of how the battery interconnect and voltage sensing assembly 60 conducts electrical current from battery cell assemblies in accordance with an exemplary embodiment will now be explained. For purposes of simplicity, only a pair of electrical terminals (e.g., a positive electrical terminal and a negative electrical terminal) from a first battery cell assembly and a pair of electrical terminals (e.g., a positive electrical terminal and a negative electrical terminal) from a second battery cell assembly will be utilized for explaining how the assembly 60 can conduct an electrical current from battery cell assemblies. In particular, the battery cell assembly 28 has a negative electrical terminal 216, and a positive electrical terminal 202 coupled to the electrical interconnect member 72. Further, the battery cell assembly 30 has a negative electrical terminal 214 coupled to the electrical interconnect member 72 and a positive electrical terminal 218 coupled to the electrical interconnect member 78. Thus, in one exemplary embodiment, an electrical current from the battery cell assemblies 28, 30 can flow in series through the electrical terminal 216, the battery cell assembly 28, the electrical terminal 202, the electrical interconnect member 78, the electrical terminal 214, the battery cell assembly 28, the electrical terminal 218, and the electrical interconnect member 78. In other words, in one exemplary embodiment, the electrical interconnect members 72, 78 electrically couple the battery cell assemblies 28, 30 in series to one another.

Figure 10:
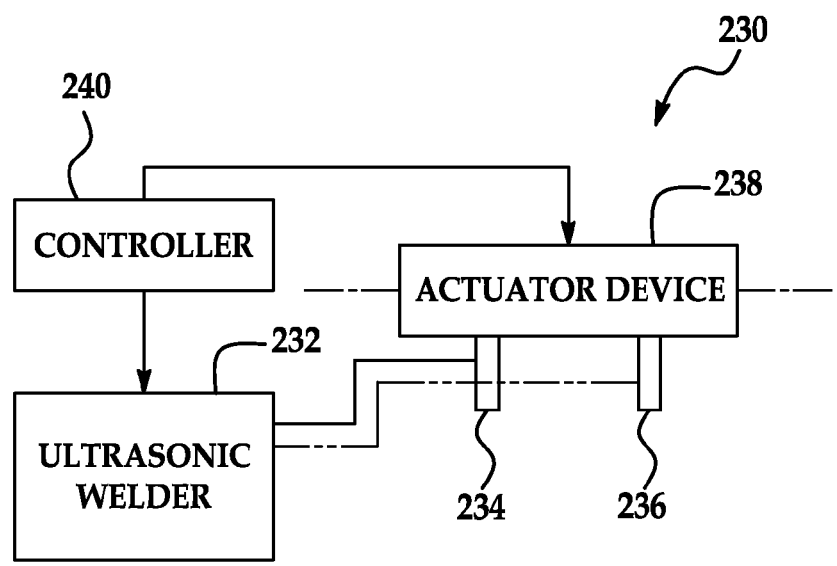
FIG. 10 is a schematic of an ultrasonic welding system for welding electrical terminals of battery cell assemblies to the battery cell interconnect and voltage sensing assembly of FIG. 3.

Referring to FIGS. 8 and 10, a system 230 for ultrasonically welding electrical terminals from battery cell assemblies to electrical interconnect members of the battery cell interconnect and voltage sensing assembly 60 is illustrated. The system 230 includes an ultrasonic welder 232, welding electrical terminals 234, 236, an actuator device 238, and a controller 240. The controller 240 operably communicates with the ultrasonic welder 232 and the actuator device 238.

A method for coupling a battery cell assembly to the battery cell interconnect and voltage assembly 60 utilizing the system 230 will now be explained. For purposes of simplicity, ultrasonically welding two electrical terminals of a battery cell assembly to an electrical interconnect member of the assembly 60 will be described. However, it should be understood that a plurality of additional electrical terminals from the battery cell assembly could be welded to the electrical interconnect member.

Initially, a user disposes the electrical terminal 202 of a first battery cell assembly through the slot 96 of the circuit board 70 such that the electrical terminal 202 contacts the side wall 184 of the electrical interconnect member 72.

Next, the user disposes the electrical terminal 214 of a second battery cell assembly through the slot 98 of the circuit board 70 such that the electrical terminal 214 contacts the side wall 182 of the electrical interconnect member 72.

Next, the controller 240 induces the actuator device 238 to move the welding electrode 234 proximate to the side wall 184, and to move the welding electrode 236 proximate to the electrical terminal 202 disposed adjacent to the side wall 184 of the electrical interconnect member 72 such that the electrical terminal 202 and the side wall 184 are sandwiched between the welding electrodes 234, 236.

Next, the controller 240 induces the ultrasonic welder 232 to ultrasonically weld the electrical terminal 202 to the side wall 184 utilizing the welding electrodes 234, 236.

Next, the controller 240 induces the actuator device 238 to move the welding electrode 234 proximate to the electrical terminal 214 disposed adjacent to the side wall 182 and to move the welding electrode 236 proximate to the side wall 236 such that the electrical terminal 214 and the side wall 182 are sandwiched between the welding electrodes 234, 236.

Next, the controller 240 induces the ultrasonic welder 232 to ultrasonically weld the electrical terminal 214 to the side wall 182 of the electrical interconnect member 72.

The battery cell interconnect and voltage sensing assembly 60 provides a substantial advantage over other methods for coupling battery cells together. In particular, the assembly 60 provides a technical effect of supporting electrical terminals from battery cell assemblies utilizing electrical interconnect members on a circuit board and routing electrical current from the battery cell assemblies utilizing the electrical interconnect members. Further, the assembly 60 routes voltage signals from the electrical interconnect members through electrical traces to an electrical connector to sense a voltage at each of the electrical interconnect members.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed for carrying this invention, but that the invention will include all embodiments falling within the scope of the appended claims. Moreover, the use of the terms, first, second, etc. are used to distinguish one element from another. Further, the use of the terms a, an, etc. do not denote a limitation of quantity, but rather denote the presence of at least one of the referenced items.

We claim:

1. A battery cell interconnect and voltage sensing assembly, comprising:

a circuit board having a first side and a second side, the circuit board further having first and second slots and first and second apertures extending therethrough, the second side having a first electrical trace disposed thereon;

a first electrical interconnect member having a first rectangular plate, first and second side walls, and first and second tabs, the first rectangular plate being disposed on the first side of the circuit board, the first rectangular plate further having first, second, third, and fourth edges, the first and second side walls extending from the first and second edges, respectively, outwardly from the first rectangular plate in a first direction, the first and second tabs extending from the third and fourth edges, respectively, in a second direction and through the first and second apertures of the circuit board, the first tab being electrically coupled to the first electrical trace on the second side of the circuit board, the first side wall being configured to contact a first electrical terminal of a first battery cell assembly that extends through the first slot of the circuit board, the second side wall being configured to contact a second electrical terminal of a second battery cell assembly that extends through the second slot of the circuit board, such that the first electrical interconnect member electrically couples the first electrical terminal to the second electrical terminal; and an electrical connector disposed on the first side of the circuit board and being electrically coupled to the first electrical trace, the first electrical trace extending from the electrical connector to the first tab for sensing a first voltage at the first tab.

2. The battery cell interconnect and voltage sensing assembly of claim 1, wherein the first electrical interconnect member is constructed from copper or nickel-plated copper.

3. The battery cell interconnect and voltage sensing assembly of claim 1, further comprising a microprocessor electrically coupled to the first electrical interconnect member, the microprocessor configured to measure the first voltage and to store a first voltage value associated with the first voltage in a memory device.

4. The battery cell interconnect and voltage sensing assembly of claim 1, wherein the circuit board further has third and fourth slots and third and fourth apertures extending therethrough, the second side further having a second electrical trace disposed thereon;

a second electrical interconnect member having a second rectangular plate, third and fourth side walls, and third and fourth tabs, the second rectangular plate being disposed on the first side of the circuit board, the second rectangular plate having fifth, sixth, seventh, and eighth edges, the third and fourth side walls extending from the fifth and sixth edges, respectively, outwardly from the second rectangular plate in the first direction, the third and fourth tabs extending from the seventh and eighth edges, respectively, in the second direction and through the third and fourth apertures of the circuit board, the third tab being electrically coupled to the second electrical trace on the second side of the circuit board, the third side wall being configured to contact a third electrical terminal of the second battery cell assembly that extends through the third slot of the circuit board, the second side wall being configured to contact a fourth electrical terminal of a third battery cell that extends through the fourth slot of the circuit board, such that the second electrical interconnect member electrically couples the second battery electrical terminal to the third battery electrical terminal; and the electrical connector further electrically coupled to the second electrical trace, the second electrical trace extending from the electrical connector to the third tab for sensing a second voltage at the third tab.

5. A method for coupling battery cells to a battery cell interconnect and voltage sensing assembly, the battery cell interconnect and voltage sensing assembly having a circuit board and an electrical interconnect member, the circuit board having a first side and a second side, the circuit board further having first and second slots and first and second apertures extending therethrough, the electrical interconnect member having a first rectangular plate, first and second side walls, and first and second tabs, the first rectangular plate being disposed on the first side of the circuit board, the first rectangular plate further having first, second, third, and fourth edges, the first and second side walls extending from the first and second edges outwardly from the first rectangular plate in a first direction, the first and second tabs extending from the third and fourth edges, respectively, in a second direction and through the first and second apertures of the circuit board, the method comprising:

disposing a first electrical terminal of a first battery cell assembly through the first slot of the circuit board such that the first electrical terminal contacts the first side wall of the electrical interconnect member;

disposing a second electrical terminal of a second battery cell assembly through the second slot of the circuit board such that the second electrical terminal contacts the second side wall of the electrical interconnect member;

ultrasonically welding the first electrical terminal to the first side wall of the electrical interconnect member; and ultrasonically welding the second electrical terminal to the second side wall of the electrical interconnect member.

* * * * *